(12) United States Patent
Choi et al.

(10) Patent No.: US 11,463,099 B2
(45) Date of Patent: Oct. 4, 2022

(54) APPARATUS AND METHOD FOR PROCESSING RESOLVER SIGNAL

(71) Applicant: HYUNDAI MOBIS CO., LTD., Seoul (KR)

(72) Inventors: Jae Won Choi, Seoul (KR); Sung Hoon Bang, Goyang-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 65 days.

(21) Appl. No.: 17/101,575

(22) Filed: Nov. 23, 2020

(65) Prior Publication Data
US 2021/0184690 A1 Jun. 17, 2021

(30) Foreign Application Priority Data
Dec. 12, 2019 (KR) .................. 10-2019-0165281

(51) Int. Cl.
*H03M 1/48* (2006.01)
*H02K 24/00* (2006.01)
*G01D 5/20* (2006.01)

(52) U.S. Cl.
CPC .......... *H03M 1/485* (2013.01); *G01D 5/2073* (2013.01); *H02K 24/00* (2013.01)

(58) Field of Classification Search
CPC ...... H03M 1/485; H03M 1/06; G01D 5/2073; G01D 5/20; G01D 5/204
(Continued)

(56) References Cited

U.S. PATENT DOCUMENTS

2007/0219733 A1* 9/2007 Kawaguchi .......... G01D 5/2073
702/66
2014/0347040 A1* 11/2014 Kawase ............... G01D 5/2448
324/207.12
(Continued)

FOREIGN PATENT DOCUMENTS

JP 2007-248246 A 9/2007
JP 2007-315856 A 12/2007
(Continued)

OTHER PUBLICATIONS

Notice of Allowance issued in corresponding Korean Patent Application No. 10-2019-0165281 dated Aug. 3, 2021, with English translation.
(Continued)

*Primary Examiner* — Lam T Mai
(74) *Attorney, Agent, or Firm* — Morgan, Lewis & Bockius LLP

(57) ABSTRACT

A resolver signal processing apparatus processes a resolver signal output from a resolver by applying an excitation signal generated by an excitation signal generating unit. In particular, the resolver signal processing apparatus includes: a resolver signal processing unit, in which the resolver signal processing unit includes a resolver signal acquiring unit receiving the resolver signal and extracting pole information of the resolver signal, a resolver phase compensating unit compensating a pole acquisition time of extracting the pole information of the resolver signal acquiring unit, and a resolver-digital converter outputting a digital signal by using the pole information extracted from the resolver signal acquiring unit, and a resolver signal processing method using the same.

7 Claims, 7 Drawing Sheets

(58) Field of Classification Search
USPC .................................................. 341/116–155
See application file for complete search history.

(56) References Cited

U.S. PATENT DOCUMENTS

2019/0288619 A1* 9/2019 Bang ........................ H02P 6/16
2021/0105162 A1* 4/2021 Ikenaga ................. G01D 3/022

FOREIGN PATENT DOCUMENTS

| | | |
|---|---|---|
| JP | 2008-116350 A | 5/2008 |
| JP | 2012-068094 A | 4/2012 |
| JP | 2014-122884 A | 7/2014 |
| KR | 10-0936290 B1 | 1/2010 |
| KR | 10-1012741 B1 | 2/2011 |
| KR | 10-1175962 B1 | 8/2012 |
| KR | 10-2016-0049719 A | 5/2016 |
| KR | 10-1937266 B1 | 1/2019 |

OTHER PUBLICATIONS

Office Action issued in corresponding Japanese Patent Application No. 2020-190833 dated Nov. 2, 2021, with English translation.
Office Action (with English translation) dated Mar. 29, 2022, issued in corresponding Japanese Patent Application No. 2020-190833.

\* cited by examiner

APPARATUS AND METHOD FOR PROCESSING RESOLVER SIGNAL

CROSS-REFERENCE TO RELATED APPLICATION

This application claims priority to and the benefit of Korean Patent Application No. 10-2019-0165281, filed on Dec. 12, 2019, the entire contents of which are incorporated herein by reference.

FIELD

The present disclosure relates to an apparatus and a method for processing a resolver signal. More particularly, the present disclosure relates to an apparatus and a method for processing a resolver signal, which enable accurate signal processing.

BACKGROUND

The statements in this section merely provide background information related to the present disclosure and may not constitute prior art.

Cars or hybrid vehicles are generally equipped with electric motors that provide driving force. A speed sensor is attached to the electric motor in order to precisely measure a speed at the time of controlling the electric motor. As a speed sensor which is most widely used, there is an optical or magnetic incremental encoder and resolver.

The resolver includes a stator, a rotor, and a rotation transformer, and when the resolver is used as the speed sensor, there are windings that allow sinusoidal waves to be generated between the stator and the rotor. In this case, excitation voltage is applied to a primary side winding of the resolver and a location of the rotor is measured from voltage information applied to a secondary side of the resolver. That is, in order to detect the speed of the electric motor, a rotational angle speed and a rotational angle of the rotor in the electric motor are sensed to measure an absolute location of the rotor.

The sinusoidal waves are applied to the resolver as excitation signals and an output signal of the resolver output by the applied excitation signals is converted into a digital signal. However, in the resolver into which the sinusoidal signals are input, there is a phase difference between the signal input into the resolver and the signal output from the resolver due to internal elements constituting the resolver, i.e., a resistor or an inductor. In order to solve the phase difference, Korean Patent No. 10-1012741 discloses that a phase of a sinusoidal wave signal applied as the excitation signal is compensated similarly to the phase of the signal output from the resolver.

However, we have discovered that for such a phase compensation process, a process is required which separately collects a sinusoidal wave generation signal and collects information on an output signal of the resolver to determine a delayed phase, and as a result, a signal processing process is complicated.

SUMMARY

The present disclosure provides an apparatus and a method for processing a resolver signal, which obtain pole information from an output signal of a resolver without a complicated signal processing process to convert a resolver signal into a digital signal.

An exemplary form of the present disclosure provides a resolver signal processing apparatus processing a resolver signal output from a resolver by applying an excitation signal generated by an excitation signal generating unit. In one form, the resolver signal processing apparatus includes: a resolver signal processing unit including: a resolver signal acquiring unit receiving the resolver signal and extracting pole information of the resolver signal, a resolver phase compensating unit compensating a pole acquisition time of extracting the pole information of the resolver signal acquiring unit, and a resolver-digital converter outputting a digital signal by using the pole information extracted from the resolver signal acquiring unit, according to the pole acquisition time compensated by the resolver phase compensating unit.

In an exemplary form, the resolver-digital converter may output the digital signal by using an envelope of the resolver signal formed by using the extracted pole information.

The resolver signal acquiring unit may extract a plurality of sampling signals from the resolver signal by using a predetermined phase delay initial value, and the resolver phase compensating unit may determine whether there is pole information in the plurality of sampling signals and calculate a pole acquisition time by compensating the phase delay initial value.

In an exemplary form, when there is the pole information in the plurality of sampling signals, the resolver phase compensating unit may compensate the pole acquisition time so that a sampling signal having a largest value or a smallest value among a plurality of sampling signals becomes a pole.

When there is no pole information in the plurality of sampling signals, the resolver phase compensating unit may calculate the pole acquisition time by adding and subtracting the phase delay initial value according to an increase or decrease of a size of the sampling signal.

Another exemplary form of the present disclosure provides a resolver signal processing method including: (a) applying a sinusoidal excitation signal to a resolver; (b) receiving a resolver signal from the resolver and compensating a pole information acquisition time of the resolver signal; (c) extracting pole information of the resolver signal according to the compensated pole information acquisition time; and (d) converting the resolver signal into a digital signal by using the pole information.

In an exemplary form, step (b) may include (b1) acquiring a plurality of sampling signals from the resolver signal by using a predetermined phase delay initial value, (b2) checking whether there is pole information in the plurality of sampling signals, and (b3) calculating the pole acquisition time by compensating the phase delay initial value according to whether there is the pole information.

In step (b3), when there is the pole information in the plurality of sampling signals, the pole acquisition time may be compensated so that a sampling signal having a largest value or a smallest value among a plurality of sampling signals becomes a pole.

In step (b3), when there is no pole information in the plurality of sampling signals, the pole acquisition time may be calculated by adding and subtracting the phase delay initial value according to an increase or decrease of a size of the sampling signal.

According to an exemplary form of the present disclosure, complicated signal processing can be omitted during a process of converting a resolver signal into a digital signal and effective signal processing is enabled by easily extracting a pole of the resolver signal.

Specifically, according to an exemplary form of the present disclosure, it is possible compensate a delayed phase without signal processing such as normalization for an excitation signal applied to a resolver or regeneration of the excitation signal.

According to an exemplary form of the present disclosure, a resolver sensor signal can be processed without synchronization between a sine signal and a cosine signal output from the resolver to reduce a data processing amount. That is, when a sinusoidal wave is used as the excitation signal applied to the resolver, it is possible to resolve a disadvantage in the related art, in that scanning all sections is required to compare the sine signal and the cosine signal with the sinusoidal wave.

The foregoing summary is illustrative only and is not intended to be in any way limiting. In addition to the illustrative aspects, forms, and features described above, further aspects, forms, and features will become apparent by reference to the drawings and the following detailed description.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
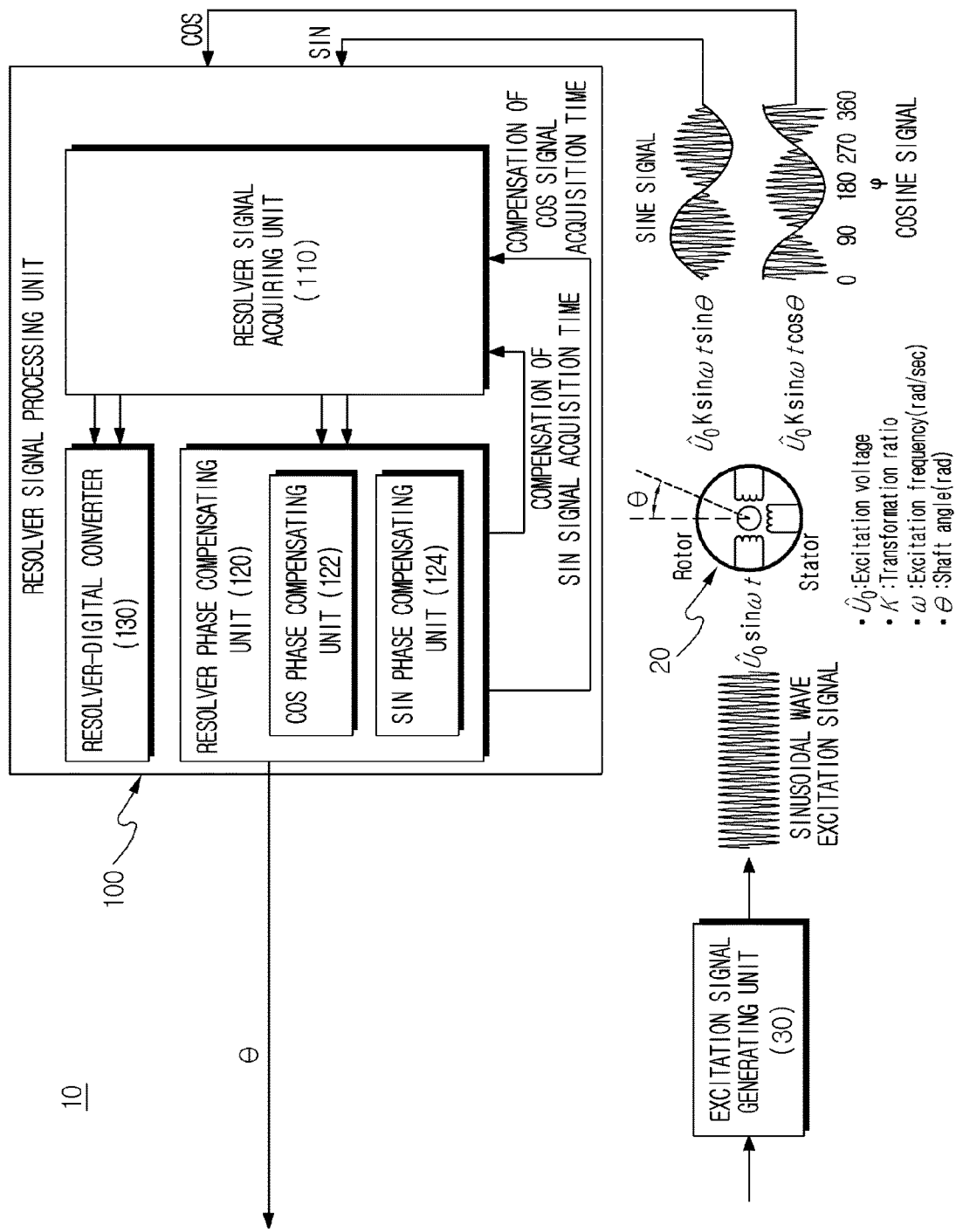
FIG. 1 is a diagram illustrating a configuration of an apparatus for processing a resolver signal according to an exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

It should be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes will be determined in part by the particular intended application and use environment.

Hereinafter, exemplary forms of the present disclosure will be described in detail with reference to the accompanying drawings. First, when reference numerals refer to components of each drawing, it is to be noted that although the same components are illustrated in different drawings, the same components are denoted by the same reference numerals as possible. Further, in describing the present disclosure, a detailed description of known related configurations and functions may be omitted to avoid unnecessarily obscuring the subject matter of the present disclosure. Further, hereinafter, the some forms of the present disclosure will be described, but the technical spirit of the present disclosure is not limited thereto or restricted thereby and the forms can be modified and variously executed by those skilled in the art.

Also, the terms, such as 'unit' or 'module', etc., should be understood as a unit that processes at least one function or operation and that may be embodied in a hardware manner (e.g., a processor), a software manner, or a combination of the hardware manner and the software manner.

Figure 2:
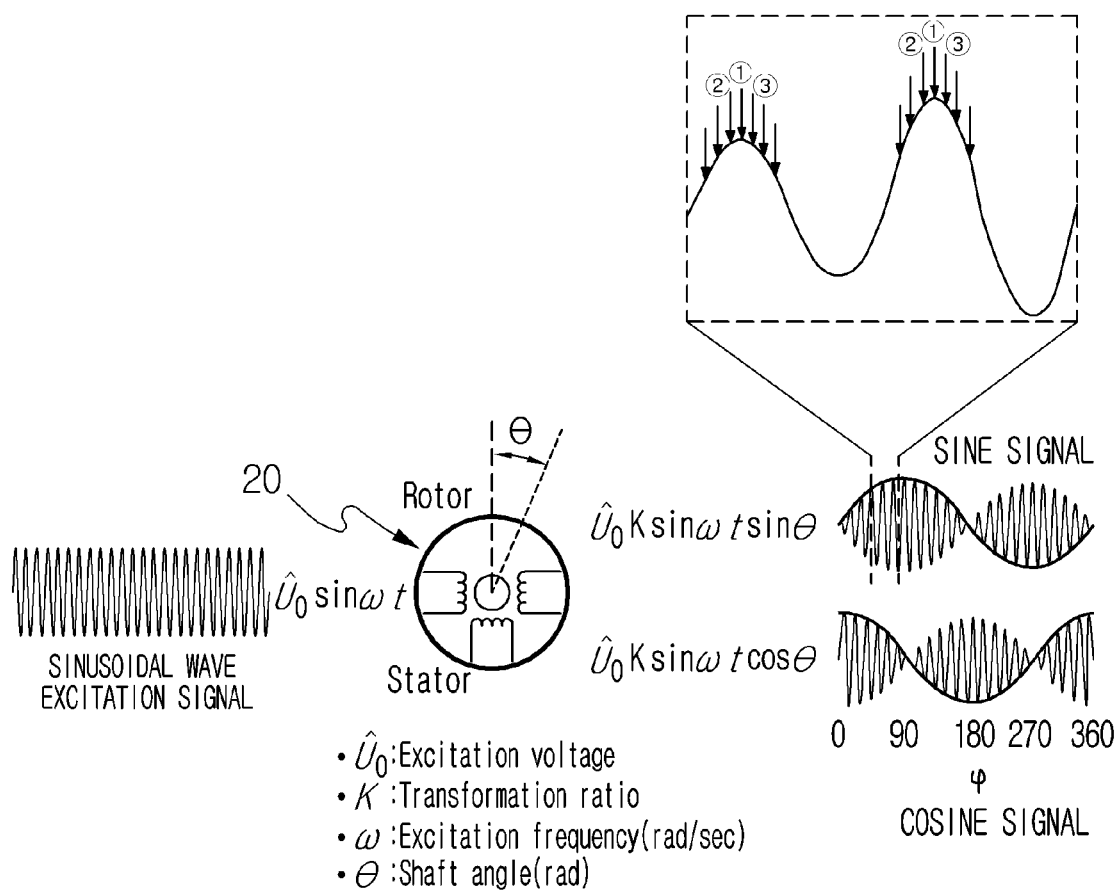
FIG. 2 is a diagram illustrating extraction of pole information for a motor output signal in an apparatus for processing a resolver signal according to an exemplary form of the present disclosure.

FIG. 1 is a diagram illustrating a configuration of an apparatus for processing a resolver signal according to an exemplary form of the present disclosure, and FIG. 2 is a diagram illustrating extraction of pole information for a motor output signal in an apparatus for processing a resolver signal according to an exemplary form of the present disclosure.

A resolver signal processing apparatus 10 according to an exemplary form of the present disclosure includes an excitation signal generating unit 30 generating an excitation signal supplied to a resolver 20 and a resolver signal processing unit 100 receiving a sine signal and/or a cosine signal output from the resolver 20 and processing the received sine signal and/or cosine signal, and converting the processed sine signal and/or cosine signal into a digital signal and outputting the digital signal.

The excitation signal generating unit 30 typically receives a square wave and converts the square wave into a sinusoidal wave to generate a sinusoidal wave excitation signal.

The sinusoidal wave excitation signal is applied to the resolver 20 mounted on a motor and the resolver 20 outputs the sine signal and the cosine signal according to a rotational angle. The sine signal and the cosine signal output from the resolver 20 are input into the resolver signal processing unit 100.

In an exemplary form, the resolver signal processing unit 100 includes a resolver signal acquiring unit 110 serving to receive the sine signal or cosine signal output from the resolver 20 and extract pole information of the sine signal and/or cosine signal, a resolver phase compensating unit 120 generating compensation information for compensating a pole acquisition time of the sine signal and/or cosine signal of the resolver signal acquisition unit 110, and a resolver-to-digital converter (RDC) 130 converting the output signal of the resolver into a digital signal by using the pole information extracted by the resolver signal acquiring unit 110.

The resolver signal compensating unit 120 may include a cosine phase compensating unit 122 for compensating an acquisition time of the cosine signal from the resolver 20 and a sine phase compensating unit 124 for compensating the acquisition time of the sine signal. The cosine phase compensating unit 122 and the sine phase compensating unit 124 may be implemented by the same scheme and however, target signals processed by respective compensating units are just different from each other.

Referring to FIG. 2, it is illustrated that the sinusoidal wave excitation signal is applied to the resolver 20 and the sine signal and/or cosine signal is output from the resolver 20 and a diagram in which a part of the sine signal is enlarged is illustrated together.

The resolver-digital converter 130 converts the resolver signal into the digital signal by using envelopes of the sine signal and the cosine signal and the resolver signal acquiring unit 110 calculate the pole information (a peak value of each signal) of the sine signal and the cosine signal. Referring to an enlarged diagram of the sine signal of FIG. 2, extracting pole information ( ) of the sine signal is required and when pre-pole information (0) or post-pole information (©) is extracted, an inaccurate result is derived.

In the present disclosure, there is one feature that the sine signal and/or cosine signal from the resolver 20, which is input from the resolver signal acquiring unit 110 is transferred to the resolver phase compensating unit 120 and information on the pole acquisition time is calculated by the resolver phase compensating unit 120 and transferred to the resolver signal acquiring unit 110 to allow the resolver signal acquiring unit 110 to extract accurate pole information.

A method for compensating the pole information acquisition time by the resolver phase compensating unit 120 for the resolver signal (the sine signal/cosine signal output from the resolver 20) acquired by the resolver signal acquiring unit 110 will be described below.

Figure 3:
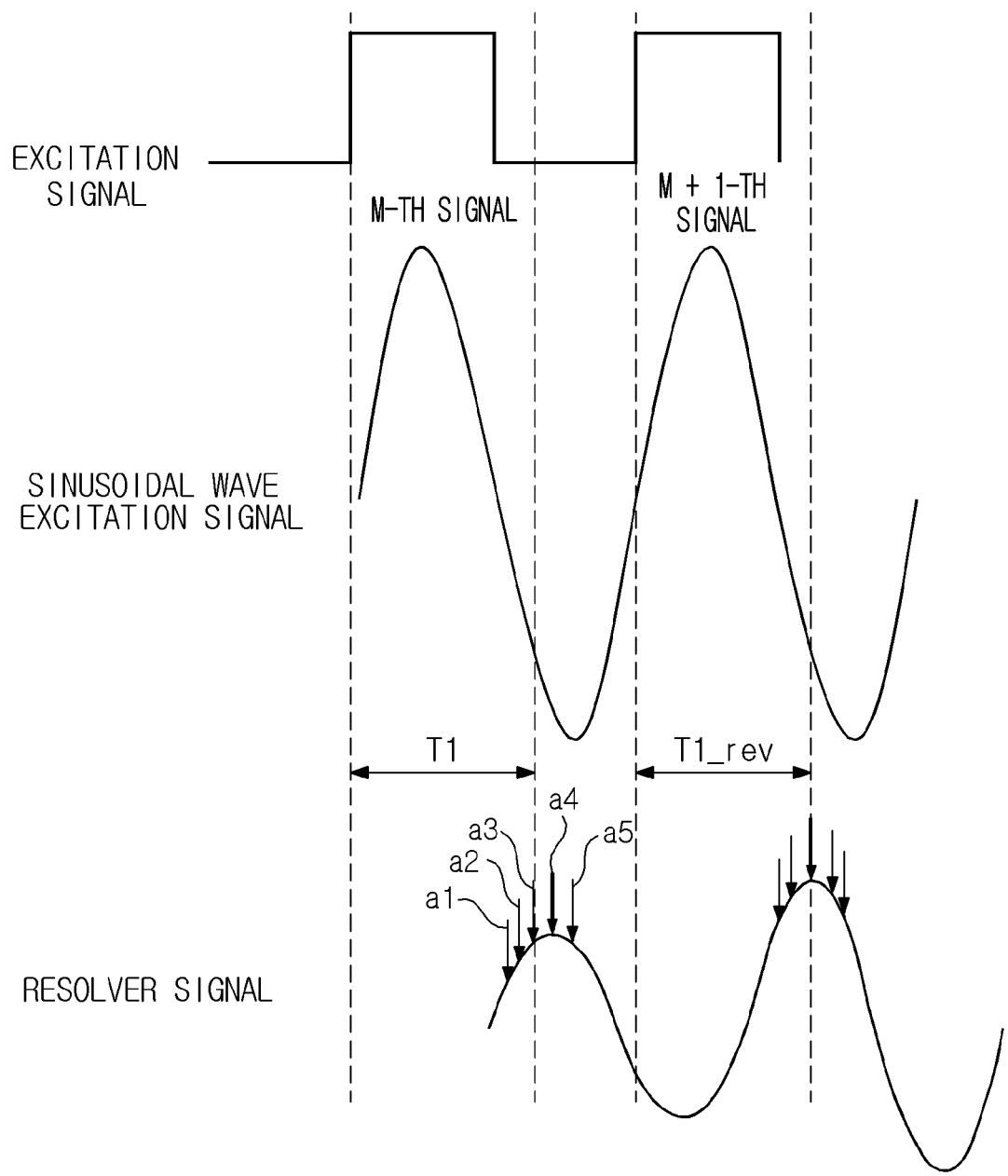
FIGS. 3 to 5 are diagrams illustrating a method for compensating a pole information acquisition time in an apparatus for processing a resolver signal according to an exemplary form of the present disclosure.
Figure 4:
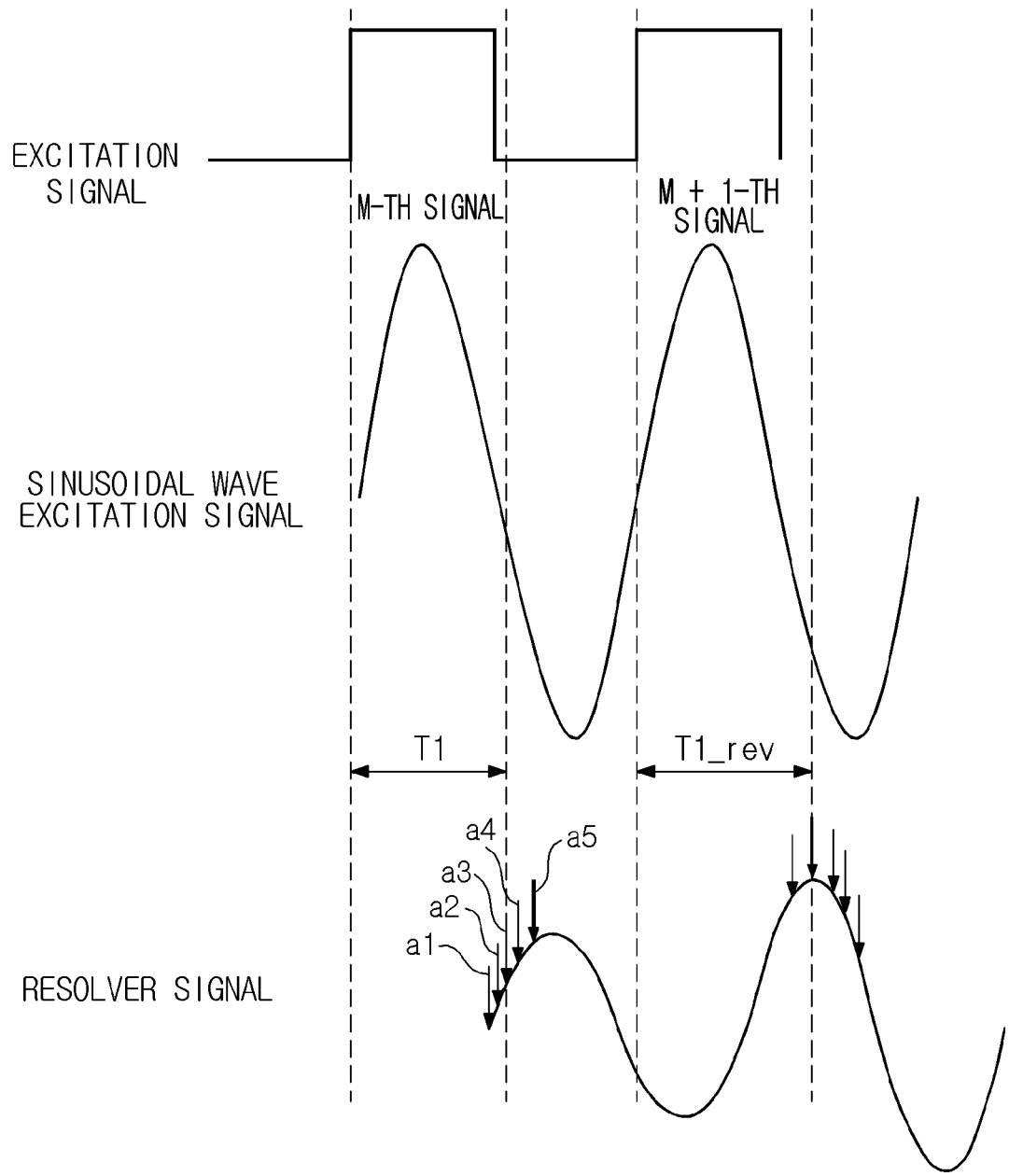
Figure 5:
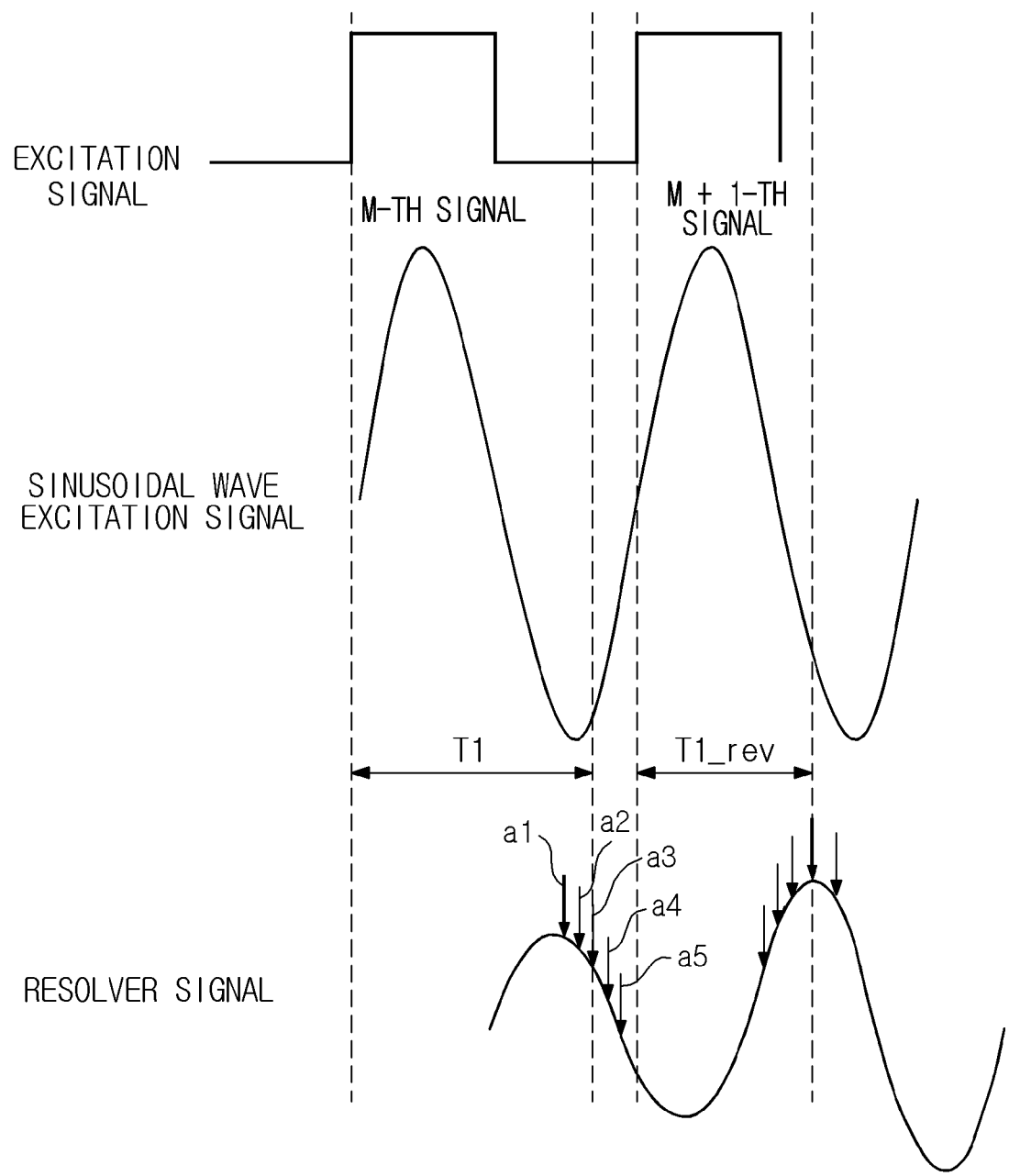

FIGS. 3 to 5 are diagrams illustrating a method for compensating a pole information acquisition time in an apparatus for processing a resolver signal according to an exemplary form of the present disclosure. FIG. 3 illustrates a state in which pole information is included in information extracted from a resolver signal, FIG. 4 illustrates a state in which a value of the information extracted from the resolver signal continuously increases, and FIG. 5 illustrates a state in which the value of the information extracted from the resolver signal continuously decreases.

In FIGS. 3 to 5, the square wave input into the excitation signal generating unit 30, the sinusoidal wave excitation signal generated by the excitation signal generating unit 30, and the resolver signal output from the resolver 20 by applying the sinusoidal wave excitation signal to the resolver 20 are illustrated. The square wave and the sinusoidal wave excitation signals theoretically synchronize with each other and in an actual state, there may be a minute error in the square wave and the sinusoidal wave excitation signals. However, in the present disclosure, it is advantageous in that even when there is the error in the peaks of the square wave and the sinusoidal wave excitation signal, the accurate pole information may be extracted from the resolver signal, thereby enabling more accurate resolver signal processing.

Meanwhile, a time from an initial time of the square wave input into the excitation signal generating unit 30 to the pole information of the resolver signal output from the resolver 20, i.e., a phase delay initial value T1 may be predetermined.

Referring to FIG. 3, a plurality of resolver signals a1, a2, a3, a4, and a5 is extracted (sampled) around time T1 which is a phase delay initial value for a resolver signal for an M-th signal of the square wave. Here, the resolver signals a1, a2, a3, a4, and a5 may be extracted at a minute time interval $\Delta T$ smaller than T1 and the number of extracted resolver signals a1, a2, a3, a4, and a5 may be 2 or more or an odd number.

In FIG. 3, there is a resolver signal a4 having a maximum value among the resolver signals a1, a2, a3, a4, and a5 for the M-th signal and since the resolver signal a4 appears after T1, an M+1-th signal (M+1-th square wave signal) is adjusted to "T1_rev=T1+$\Delta T$" to sample a plurality of resolver signals around T1_rev. Further, in some cases, it may also be possible to sample only one resolver signal at time T1_rev.

Referring to FIG. 4, a plurality of resolver signals a1, a2, a3, a4, and a5 is extracted (sampled) around time T1 which is an initial value for a resolver signal for an M-th signal of the square wave. However, the sizes of the extracted resolver signals a1, a2, a3, a4, and a5 gradually increase and a last resolver signal a5 has a maximum value. That is, there is no pole information in the extracted resolver signals a1, a2, a3, a4, and a5 and the sizes of the resolver signals are increasing. In this case, the M+1-th signal (M+1-th square wave signal) is adjusted to "T1_rev=T1+$\alpha\Delta T$ (a represents a natural number or a positive real number)" and a plurality of resolver signals is sampled around T1_rev to reevaluate adequacy of sampling.

Referring to FIG. 5, a plurality of resolver signals a1, a2, a3, a4, and a5 is extracted (sampled) around time T1 which is an initial value for a resolver signal for an M-th signal of the square wave. However, the sizes of the extracted resolver signals a1, a2, a3, a4, and a5 gradually decrease and a first resolver signal a5 has a maximum value. That is, there is no pole information in the extracted resolver signals a1, a2, a3, a4, and a5 and the sizes of the resolver signals are decreasing. In this case, the M+1-th signal (M+1-th square wave signal) is adjusted to "T1_rev=T1−$\alpha\Delta T$ (a represents a negative integer or a negative real number)" and a plurality of resolver signals is sampled around T1_rev to reevaluate adequacy of sampling.

Meanwhile, in FIGS. 3 to 5, it is illustrated that the pole information having the maximum value is extracted, but pole information having a minimum value may also be extracted by the same scheme.

Figure 6:
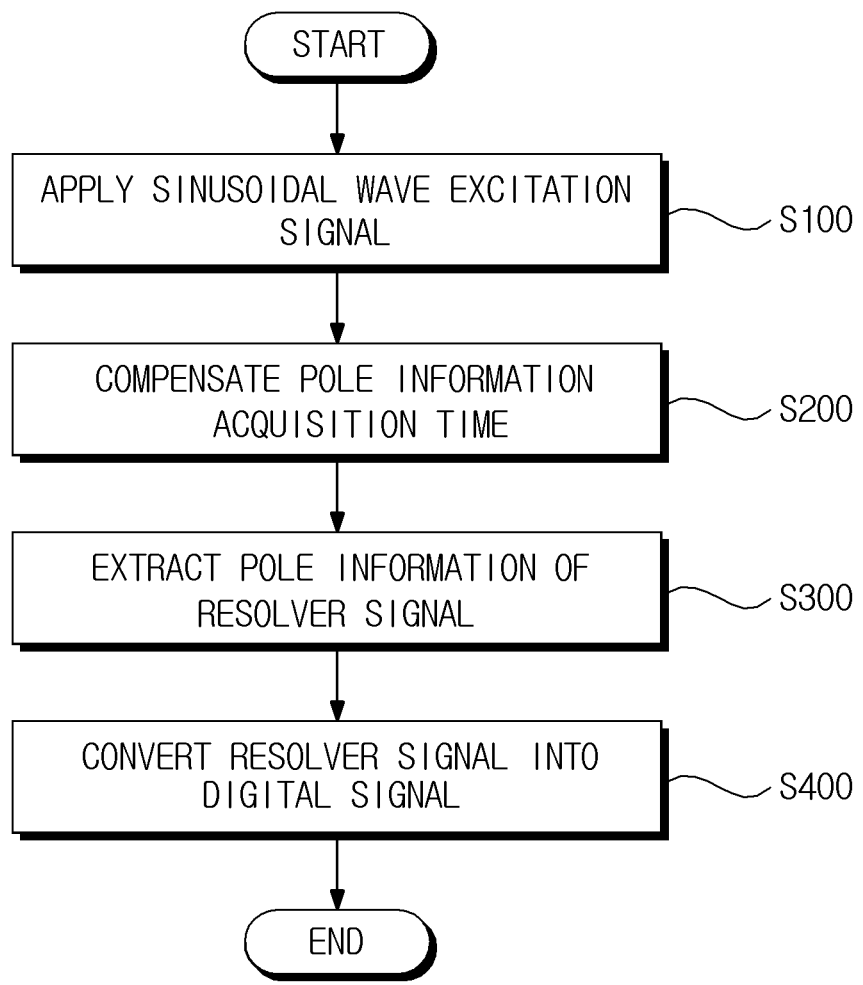
FIG. 6 is a flowchart schematically illustrating a method for processing a resolver signal according to an exemplary form of the present disclosure.
Figure 7:
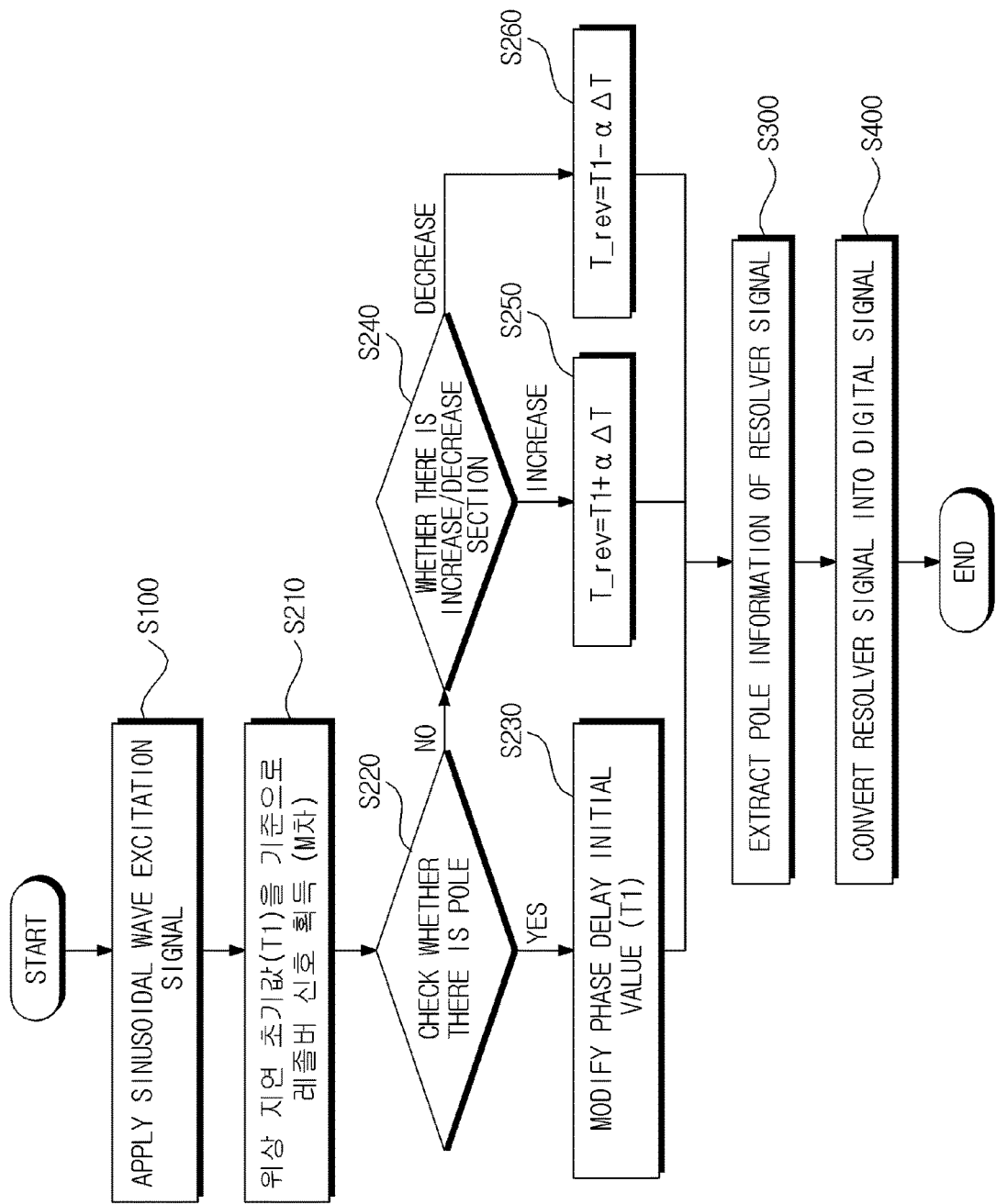
FIG. 7 is a flowchart specifically illustrating a process of compensating a pole acquisition time of a resolver signal in a method for processing a resolver signal according to an exemplary form of the present disclosure.

FIG. 6 is a flowchart schematically illustrating a method for processing a resolver signal according to an exemplary form of the present disclosure, and FIG. 7 is a flowchart specifically illustrating a process of compensating a pole acquisition time of a resolver signal in a method for processing a resolver signal according to an exemplary form of the present disclosure.

Referring to FIG. 6, the method for processing a resolver signal includes: applying a sinusoidal wave excitation signal to a resolver 20 (S100), receiving a resolver signal from the resolver 20 and compensating a pole information acquisition time of the resolver signal (S200), extracting pole information of the resolver signal according to the compensated pole information acquisition time (S300), and converting the resolver signal into a digital signal by using the extracted pole information (S400).

Referring to FIG. 7, step S200 will be described in more detail.

As a process of compensating the pole information acquisition time of the resolver signal, first, the resolver signal acquiring unit 110 acquires a plurality of resolver signals based on a phase delay initial value T1 (S210).

The resolver phase compensating unit 120 checks whether there is a pole in a plurality of resolver signals extracted by the resolver signal acquiring unit 110 (S220). When there is the pole, the phase delay initial value T1 may be maintained or as described in FIG. 3, a predetermined time is added to the phase delay initial value T1 to compensate the pole information acquisition time.

When it is determined that there is no pole in step S220, it is determined whether the plurality of extracted resolver signals increases or decreases (S240).

When the resolver signal increases, the pole information acquisition time is modified to a value (T1_rev=T1+αΔT) acquired by adding a predetermined value to the initial value T1 as described in FIG. 4 (S250).

When the resolver signal decreases, the pole information acquisition time is modified to a value (T1_rev=T1−αΔT) acquired by subtracting a predetermined value from the initial value T1 as described in FIG. 5 (S260).

After steps S250 and S260, it may be possible to further verify the modified pole information acquisition time by returning to step S210 without proceeding to step S300.

As described above, the exemplary forms have been described and illustrated in the drawings and the specification. The exemplary forms were chosen and described in order to explain certain principles of the present disclosure and their practical application, to thereby enable others skilled in the art to make and utilize various exemplary forms of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the present disclosure are deemed to be covered by the present disclosure.

What is claimed is:

1. A resolver signal processing apparatus processing a resolver signal output from a resolver by applying an excitation signal generated by an excitation signal generating unit, the resolver signal processing apparatus comprising:
    a resolver signal processing unit including:
    a resolver signal acquiring unit configured to receive the resolver signal and extract pole information of the resolver signal and extract a plurality of sampling signals from the resolver signal using a phase delay initial value, wherein the phase delay initial value is a value initially set as a time from an initial time of a square wave input into the excitation signal generating unit up to the pole information of the resolver signal,
    a resolver phase compensating unit configured to compensate a pole acquisition time of extracting the pole information of the resolver signal acquiring unit and determine whether there is pole information in the plurality of sampling signals and calculate a pole acquisition time by compensating the phase delay initial value, and
    a resolver-digital converter configured to output a digital signal using the pole information extracted from the resolver signal acquiring unit, according to the pole acquisition time compensated by the resolver phase compensating unit.

2. The resolver signal processing apparatus of claim 1, wherein the resolver-digital converter is configured to output the digital signal using an envelope of the resolver signal formed using the extracted pole information.

3. The resolver signal processing apparatus of claim 1, wherein when there is the pole information in the plurality of sampling signals, the resolver phase compensating unit is configured to compensate the pole acquisition time so that a sampling signal having a largest value or a smallest value among the plurality of sampling signals becomes a pole.

4. The resolver signal processing apparatus of claim 1, wherein when there is no pole information in the plurality of sampling signals, the resolver phase compensating unit is configured to calculate the pole acquisition time by adding and subtracting the phase delay initial value based on an increase or decrease of a size of the sampling signal.

5. A resolver signal processing method comprising: applying a sinusoidal excitation signal to a resolver; receiving a resolver signal from the resolver and compensating a pole information acquisition time of the resolver signal, wherein the receiving of the resolver signal and the compensating of the pole information acquisition time includes:
    acquiring a plurality of sampling signals from the resolver signal using a phase delay initial value,
    checking whether there is pole information in the plurality of sampling signals, and
    in response to checking the pole information in the plurality of sampling signals, calculating a pole acquisition time by compensating the phase delay initial value, where the phase delay initial value is a value initially set as a time from an initial time of a square wave input into an excitation signal generating unit up to the pole information of the resolver signal;
    extracting pole information of the resolver signal according to the compensated pole information acquisition time; and
    converting the resolver signal into a digital signal using the pole information.

6. The resolver signal processing method of claim 5, wherein in calculating the pole acquisition time, when there is the pole information in the plurality of sampling signals, the pole acquisition time is compensated so that a sampling signal having a largest value or a smallest value among the plurality of sampling signals becomes a pole.

7. The resolver signal processing method of claim 5, wherein in calculating the pole acquisition time, when there is no pole information in the plurality of sampling signals, the pole acquisition time is calculated by adding and subtracting the phase delay initial value based on an increase or decrease of a size of the sampling signal.

* * * * *